(12) United States Patent
Thomas

(10) Patent No.: US 12,369,318 B1
(45) Date of Patent: Jul. 22, 2025

(54) NVM-ALEFT-ISD-LTSEE

(71) Applicant: Mammen Thomas, Seattle, WA (US)

(72) Inventor: Mammen Thomas, Seattle, WA (US)

( * ) Notice: Subject to any disclaimer, the term of this patent is extended or adjusted under 35 U.S.C. 154(b) by 0 days.

(21) Appl. No.: 18/786,937

(22) Filed: Jul. 29, 2024

(51) Int. Cl.
*H10D 30/68* (2025.01)
*H10B 41/30* (2023.01)

(52) U.S. Cl.
CPC .......... *H10B 41/30* (2023.02); *H10D 30/6892* (2025.01); *H10D 30/6894* (2025.01)

(58) Field of Classification Search
CPC .................................................. H10D 30/6892
See application file for complete search history.

*Primary Examiner* — Grant S Withers

(57) ABSTRACT

Device scaling has increased the device density of integrated circuits (ICs) and reduced the cost of circuits. Today development of new device structures, use of new materials and complex process steps are implemented to continue scaling of the semiconductor devices. The added manufacturing steps and complexity have increased cost of ICs directly impacting the implementation of IoT devices that need low cost and high yields to be successful. ALEFT-ISD-LTSEE is a device that reduces the cost of manufacture while allowing scaling and improving device performance. One of the requirements of IoT devices is the ability to store data on chips designed. This requires integratable memory with the low cost of manufacture. NVM-ALEFT-ISD-LTSEE is an easily integratable non-volatile memory device that is integratable with the ALEFT-ISD-LTSEE devices with minimum additional processing. ALEFT-ISD-LTSEE with NVM-ALEFT-ISD-LTSEE is hence a suitable technology combination for the IoT devices.

7 Claims, 2 Drawing Sheets

NVM cell with ALEFT-ISD-LTSEE {Advanced Low Electrostatic Field Transistor (LEFT) Using implanted S/D and Selective Low Temperature Epitaxial Extension(ISD-LTSEE)}

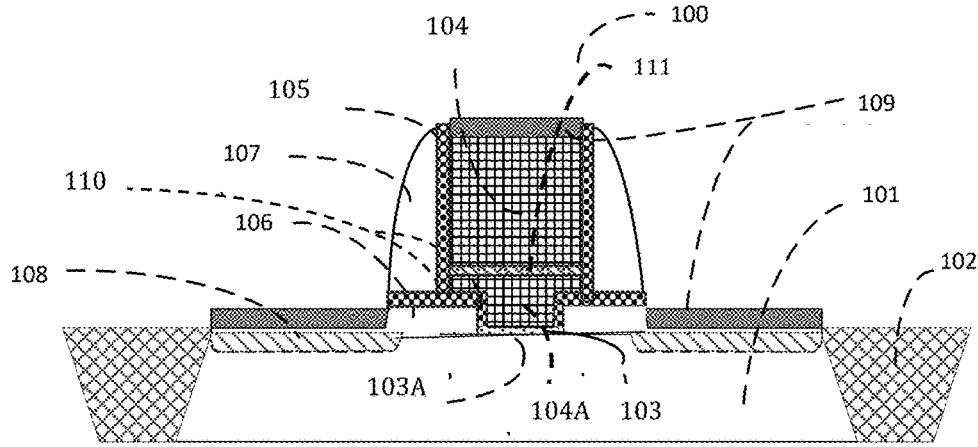

NVM cell with ALEFT-ISD-LTSEE {Advanced Low Electrostatic Field Transistor (LEFT) Using implanted S/D and Selective Low Temperature Epitaxial Extension(ISD-LTSEE)}

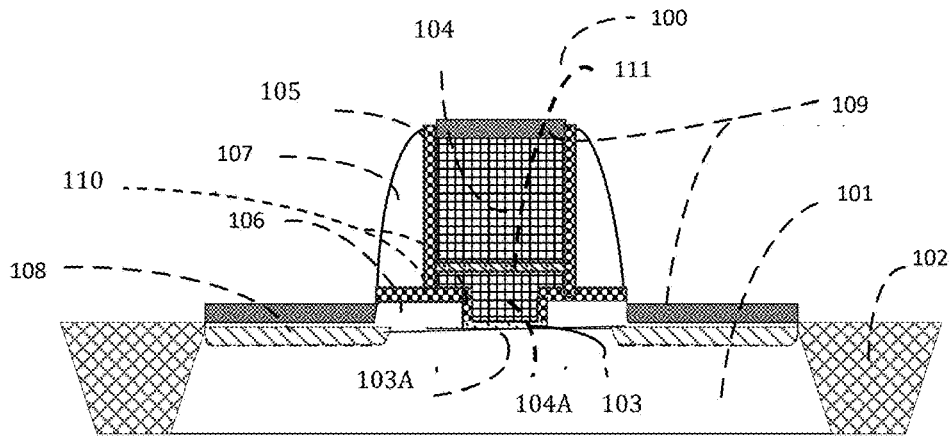

FIG. 1

Cross section of Advanced Low Electrostatic Field Transistor
Note: shallow S/D implanted using sacrificial spacer

Typical process flow for NVM integrated into ALEFT-ISD-LTSEE

| | Process | Mask | Implant |
|---|---|---|---|
| 1. | Start wafer | 0 | 0 |
| 2. | Do shallow trench isolation | 1 | 0 |
| 3. | Standard well implants | 2 | 2 |
| 4. | Grow sac ox, dep Nitride, deposit oxide | 0 | 0 |
| 5. | Mask P regions clean Ox/N/Oxide | 1 | 0 |
| 6. | Grow Selective N-epi / N+-epi | 0 | 0 |
| 7. | Grow Oxide on N epi, cover with Nitride | 0 | 0 |
| 8. | Mask N regions clean Ox/N/Oxide | 1 | 0 |
| 9. | Grow selective P-epi /P+-Epi | 0 | 0 |
| 10. | Grow Oxide on P epi, cover with Nitride | 0 | 0 |
| 11. | Mask gate channel in N and P regions | 1 | 0 |
| 12. | Etch N/ Oxide and time etch Epi to expose Si | 0 | 0 |
| 13. | Deposit side wall dielectric cover | 0 | 0 |
| 14. | Selective etch to remove dielectric from gate region | 0 | 0 |
| 15. | Grow or dep tunnel/ gate dielectric (3 thicknesses) | 2 | 0 |
| 16. | First gate conductor dep, Deposit ONO | 0 | 0 |
| 17. | Mask and Leave ONO in NVM regions | 1 | 0 |
| 18. | Second gate conductor dep | 0 | 0 |
| 19. | Mask and Etch gate conductor (1st, ONO and 2$^{nd}$) | 1 | 0 |
| 20. | Gate conductor side wall dielectric - spacer | 0 | 0 |
| 21. | Iso Spacer etch | 0 | 0 |
| 22. | ( to clear surface ox Nitride from epi & top of gate conductor) | | |
| 23. | Mask P device and implant N; Mask N device implant P | 2 | 2 |
| 24. | Low-temp anneal, Silicide formation | 0 | 0 |
| 25. | ILD , Planarize, Contact Mask | 1 | 0 |
| 26. | Total | 13 | 4 |

FIG. 2 (table 1)

Description of numbering of FIG. 1

| | |
|---|---|
| 100 | - Cross section of NVM cell implemented over ALEFT-ISD-LTSEE. |
| 101 | - Fixed Low dosed well or substrate with low impurity doping. |
| 102 | - Shallow Trench isolation |
| 103 | - Gate dielectric on the well or substrate surface |
| 103A | - Cannel region under the gate dielectric |
| 104 | - Conductive gate material -forming control gate |
| 104A | - floating gate |
| 105 | - Side wall protection dielectric / side wall oxide |
| 106 | - Selective Low temperature epitaxial Source/ Drain extension |
| 107 | - Spacer Dielectric |
| 108 | - Implanted shallow Source/Drain |
| 109 | - Silicided Contacts |
| 110 | - Gate protection Dielectric/ oxide |
| 111 | - Coupling Dielectric coupling the control gate to floating gate (Typically ONO) |

FIG. 3 (Table 2) {New Fig.}

NVM-ALEFT-ISD-LTSEE

FIELD OF INVENTION

This invention relates to a non-volatile memory cell using a new semiconductor device and processing of the same with low or reduced electric fields reducing short channel issues and threshold voltage variability for ensuring high quality and characteristics of operation of miniaturized devices.

BACKGROUND OF THE INVENTION AND THE NEED FOR THE INVENTION

Over the past decade or more scaling of the semiconductor devices has been following Moore's law. But the scaling is bumping against issues of high levels of doping, short channel effects, and threshold variations due to random dopant distribution near and under the gate, that limit the capabilities, quality and characteristics of these small devices.

Device scaling has been instrumental in increasing the device density of integrated circuits (ICs) and reducing the cost of these circuits. Today development of new device structures, use of new materials and implementation of complex process steps have to be considered to continue scaling of the semiconductor devices. The number of steps and cost of each step of processing ICs have also increased with the complexity increase. These process and technology innovations come with associated cost of circuit implementations.

Memories such as non-volatile memories and dynamic and static rams that can be integrated with the new devices will be useful enablers especially if the memory devices can be produced on the same semiconductor substrate without introducing complex process steps.

It will hence be optimum if a simpler device structure with simpler processing (with reduced number of steps) that is closer to the original simple process flows in the fab, while having improved short channel effects capable of generating integrated non-volatile memory cells is made available to continue the scaling of usable devices.

The currently filed and pending LEFT-ISD-LTSEE {Low Electrostatic Field Transistor (LEFT) Using implanted S/D and thin (typically having a thickness of the order of 2 to 12 nm) Selective Low Temperature Epitaxial Extension (ISD-LTSEE)} technology (the typical low temperature selective epitaxial growth or deposition is in the temperature range of 300-650 degree centigrade) is one such, that allows scaling of devices without undue stress on lithography to about 20 nm (existing masking capability in the range of 13 to 35 nm) with lower cost of masking and manufacture.

The technology also provides for low temperature processing of the device, especially after the low temperature selective epitaxial growth or deposition (typically the post processing after selective epitaxial growth or deposition is also controlled in the temperature range of 300-650 degree centigrade) which reduces or eliminates the diffusion of the dopants within and from the processed doped layers of the transistor.

The current sweet-spot for low cost device manufacture is 30 to 18 nm especially for IoT products that are very sensitive to cost of product which is limited by the manufacturing cost. Pushing the technology to a lower channel size with out undue increase in manufacturing cost is always an aim for the device technologist. If integrated memory devices can be introduced with minimum process changes and complexity it will provide a much higher impact on the products. What is needed today is to find a way to scale the devices and include integrated memory devices without increasing the process complexity and cost unduly. This is what is being proposed in the current application.

The Inventive Idea

The pending application ALEFT-ISD-LTSEE {Advanced Low Electrostatic Field Transistor (LEFT) using implanted S/D and Selective Low Temperature Epitaxial Extension (ISD-LTSEE)} is to allow the gate/channel length of transistors to be scaled below the 18 nm level, even down to 2 nm with appropriate masking of one layer on flat wafer surface, without undue increase in cost of masking and manufacture. The ALEFT-ISD-LTSEE technology builds on the patent applied for LEFT-ISD-LTSEE technology by enabling one additional mask, the gate mask to be used on a planar surface to enable channel length to be scaled without major impact on the rest of the process. What is proposed in the current application is a way to integrate a non-volatile memory (NVM) cell to the ALEFT_ISD_LTSEE with minimum impact on the process of manufacture.

DESCRIPTION OF FIGURES

FIG. 1—is an exemplary and non-limiting cross sectional view of an embodiment of the current invention showing the set of structural elements of the NVM (non-volatile memory) over ALEFT-ISD-LTSEE {Advanced Low Electrostatic Field Transistor (LEFT) Using implanted S/D and Selective Low Temperature Epitaxial Extension (ISD-LTSEE)} Transistor/Device per the invention.

FIG. 2—is a Table 1 showing an exemplary and non-limiting process flow for implementing an embodiment of the invention shown in FIG. 1.

FIG. 3—is a table 2 showing the details of the numbering used in FIG. 1.

Even though the embodiment shown is currently the preferred embodiment it is not to be taken as a limiting embodiment. There can be and will be possible embodiments that improve on the current embodiment shown that arise out of knowledge base that exist today and future improvements in technology and processing over time. Detailed Description of the NVM Over ALEFT-ISD-LTSEE {Advanced Low Electrostatic Field Transistor (ALEFT) Using Implanted S/D and Selective Low Temperature Epitaxial Extension (ISD-LTSEE)}

Device scaling has increased the device density of integrated circuits (ICs) and reduced the cost of circuits. Today development of new device structures, use of new materials and implementation of complex process steps are implemented to continue scaling of the semiconductor devices. The added manufacturing steps and complexity have resulted in increased cost of ICs directly impacting the implementation of IoT devices that need low cost and high yields to be successful.

ALEFT-ISD-LTSEE is a device that reduces the cost while improving device performance. ALEFT-ISD-LTSEE is suitable for sub 20 nm sizes (typically 2-18 nm gate lengths) where random threshold variation due to impact of discrete dopants in and around the channel becomes a critical consideration. By using ALEFT-ISD-LTSEE the random threshold variation due to impact of discrete dopants in and around the channel is reduced by elimination of a number of implants and drives. Also, by having a flat field profile at and around the gate, by use of low temperature epitaxy as source/drain extension, the short channel effects, and the impact of line edge variations of the gate are also reduced.

The disclosed ALEFT-ISD-LTSEE structure builds on the technology and processes used for patent pending LEFT-ISD-LTSEE transistor to achieve smaller gate lengths and associated channel sizes (gate/channel shrinkage). Since the process and technology of ALEFT-ISD-LTSEE are built on the original LEFT-ISD-LTSEE process and technology, it is able to bring with it all the advantages of the LEFT-ISD-LTSEE device.

A simplified device technology that can be implemented with a reduced number of masking and process steps is proposed for the ALEFT-ISD-LTSEE based on the prior disclosed LEFT-ISD-LTSEE. The device structure reduces the effect of short channel effects on the operation of the devices developed and allow the devices to be scaled with minimum increase in device complexity. The processing is made much simpler by reduction or elimination of implant steps and associated high temperature activation/drives but uses new available technology with lower temperature processing and low temperature selective epitaxial depositions. The replacement/elimination of critical implant around the gate of the device and the associated activation steps reduce uncertainty of dopant location relative to the channel and help reduce the associated variability of device characteristics. The reduction in short channel effects and reduction in variability of device characteristics enable the devices to move down the device scaling and integration path. The disclosed device and technology are usable for device processing on planar semiconductor wafers, on Silicon on Insulator (SOI) and even for unique device structures like FinFET at and below the 20 nm device dimensions.

One of the enablers to the use of the technology, especially in IoT devices is the ability to integrate non-volatile memory into the product without unduly increasing the wafer cost by introduction of complex process technologies. The ALEFT-ISD-LTSEE transistor allows integration of the NVM cell with minimum technological challenge.

FIG. 1 shows an exemplary embodiment showing a cross section of the NVM-ALEFT-ISD-LTSEE transistor and the structural details. FIG. 2 is a table showing an exemplary process flow for the device NVM-ALEFT-ISD-LTSEE transistor shown in FIG. 1. The embodiment uses the gate width and where needed a sacrificial spacer to implement the low temperature selective epitaxial source and drain extensions (106). These low temperature selective epitaxial source drain extensions (106) are enabled for variations in selective epitaxial thickness adjustment and insitu doping as required to adjust the S/D resistance of the finished NVM-ALEFT ISD-SEE (100) transistor device. Though in situ doping of the epitaxial extension is preferred to limit the knock on ions propagating into the substrate, implanting the low temperature epitaxial silicon using low voltage implanters is hence not ruled out as long as the effect of knock on ions into the can be mitigated or eliminated.

Typical processing can use the width of the conductive gate (104)/gate electrode (104+105) to implant the shallow source and drains (108). The use of a spacer (107) as a mask at implant (sacrificial or otherwise-sacrificial may be removed if necessary) is only needed when the spacing of the channel from the shallow implanted Source and drain is insufficient to eliminate the knock on dopants from the implant influencing the channel characteristics. By removing the implants from the vicinity of the channel the influence of the vertical field at the channel edge, influencing/controlling the channel is reduced. Typically, due to the flat nature of the fields around the gate the electrostatic fields perpendicular to the plane of the gate dielectric to substrate interface are less than $5\times10^5$ volts/cm over more than 50% of the channel area under all operating conditions.

The NVM-ALEFT-ISD-LTSEE transistor (100) is built on the patent pending ALEFT-ISD-LTSEE transistor structure. The gate/channel region (103A) is defined by the selective low temperature epitaxial growth. The gate region prior to the selective epitaxial growth is masked on the flat wafer surface having an oxide/Nitride/Oxide cover, to leave the original dielectric layer intact in the gate region such that the selective epitaxial growth does not happen in the gate region. The grown selective epitaxial extension and the vertical side walls are then covered by a thicker gate protection dielectric (110) such that the epitaxial extensions have a thicker protective dielectric layer on the surface that is thicker than the gate or tunnel dielectric that is grown/deposited in the gate region. The dielectric layer in the gate/channel region (103A) is removed and the tunnel dielectric (103) is grown or deposited on the cleaned substrate/well (101) over the channel region (103 A). The conductive gate material forming the floating gate electrode (104A) is deposited. A coupling dielectric is deposited over the floating gate conductive electrode. The coupling dielectric is removed from the regions where the NVM-ALEFT-ISD-LTSEE transistor is not being formed but and the ALEFT-ISD-LTSEE transistor is implemented over a gate dielectric. A second conductive gate layer (104) forming the control gate of the NVM-ALEFT-ISD-LTSEE transistor structure is deposited. The gate structure is masked and etched and the side walls covered by a protection oxide/dielectric (105). This completes the exemplary gate structure of the NVM-ALEFT-ISD-LTSEE transistor (100) and the simultaneously formed ALEFT-ISD-LTSEE transistor elsewhere on the substrate. The ALEFT-ISD-LTSEE transistor comprising the conductive gate electrode (104) over the gate dielectric with a gate protection dielectric (110) protecting the side walls. The side walls of the conductive gate protected by a protection oxide/dielectric (105). The NVM-ALEFT-ISD-LTSEE transistor comprise the channel (103A) that can be controlled by a charge stored on the conductive gate floating gate electrode (104A) over the tunnel dielectric (103). The floating gate with coupling to the control gate (104) across the coupling dielectric (111) enable programming and erase voltages to be applied to the floating gate (104A) via the control gate. The process defined enable the tunnel gate definition to be done on a flat semiconductor surface and the gate to be defined by the low temperature selective epitaxial growth of the source and drain extensions (106) typically in contact with the shallow S/D junctions in the substrate.

The Non-Volatile Memory cell (100) formation is done by very simple process step additions to the patent pending ALEFT-ISD-LTSEE transistor process. The added steps comprise 1. Growing/depositing a tunnel dielectric (103) Instead of the gate dielectric in the NVM device locations. 2. Splitting the deposition of the conductive gate material into two depositions and 3. Depositing a coupling dielectric, typically an oxide/Nitride/Oxide or ONO (111) to separate the two layers of conductive gate material in the NVM regions.

The coupling dielectric is left in the NVM-ALEFT-ISD-LTSEE transistor regions but removed from the ALEFT-ISD-LTSEE transistor regions prior to the second layer of conductive gate material. The gate etch and subsequent process are similar to the process for the ALEFT-ISD-LTSEE transistor process. The completed NVM over ALEFT-ISD-LTSEE memory cell comprises a tunnel dielectric (103) over laying a channel in substrate (103A), a floating gate (104A) over the tunnel dielectric, a conductive gate/control gate (104) coupling to the floating gate across the coupling dielectric. The structure thereby forming a non-volatile memory cell with read write capability by storing charge in the floating gate 104A.

Table 1 associated with the exemplary embodiment shown in FIG. 2 provides an exemplary process flow for manufacture of the NVM-ALEFT-ISD-LTSEE transistor of embodiment in FIG. 1.

The process flow of Table 1 also identifies the number of steps, implants and thermal diffusions in the current process.

The structure and process allow either silicon gate or metal gate technology to be implemented. As an exemplary process, the silicon gate process is described. If the silicon gate is considered as a sacrificial gate, the technology can be adapted for metal gate. Further the technology is also implementable on SOI wafers with equal ease.

At times the selective epitaxial region over the shallow S/D will be completely consumed by the silicide formation. In such cases the shallow S/D implanted region (108) with overlap to the silicide contacts region will prevent leakage current from the silicided contacts (109) to the semiconductor substrate/well (101).

Use of strained silicon channel can be implemented in the above-disclosed process by adding silicon germanium or other appropriate undoped epitaxial material growth in the S/D region using and extending the use of the strain material to grow the extensions. But having reduced short channel effects will allow the gate length to be reduced substantially without undue need for strain engineering and drain engineering to achieve the needed speeds. By using undoped or low-doped epitaxial silicon as part of the substrate it is possible to achieve very high mobility for the carriers (close to intrinsic mobility) with reduced drain engineering and channel strain engineering.

Referring to Table 1.

FIG. 2—Table 1 provides a listing of the steps required to implement P and N channel NVM-ALEFT ISD-SEE (100) transistor devices, of the embodiment, shown in FIG. 1, on a silicon wafer. The common steps are grouped together in the table and a comparison of number of implants and masking steps required are provided. The listing clearly shows the substantial reduction in critical process steps that are possible with the disclosed device implementation.

The post low temperature selective epitaxial extensions and the low temperature anneal/activation of the shallow source/drain implanted junctions provides almost no dopant movement from the thin selective epitaxial layer into the silicon substrate, via the contact interface from the low temperature selective source drain epitaxial extensions to the silicon substrate and the channel of the NVM-ALEFT ISD-SEE (100) transistor device.

In addition, by providing a S/D extension which is on silicon surface almost in the plain of the channel, the impact of source and drain on the channel that creates the short channel issues and the drain engineering requirements are reduced.

Also by providing non implanted Source/Drain extensions using low temperature selective Epitaxial process and a uniformly doped well, the random variation of the threshold of the device due to random placement of dopant ions in or near the channel, namely the sigma Vt of the device is reduced substantially providing the device the capability to use lower supply voltages and scale to much smaller dimensions with very limited additional effort.

The large area of coupling between the floating gate and the control gate compared to the tunnel area provide a high coupling ratio that help to reduce the voltage on the control gate during the write operations. This is helpful in that the voltage pump design and the peripheral transistor design are made lower voltage compatible. The stress on the gate oxide to the peripheral ALEFT ISD-SEE devices are hence reduced.

One of the major items to be noted in comparing the characteristics of prior art devices on planar silicon surface with the characteristics of the ALEFT ISD-SEE (100) transistor characteristics is that the ALEFT ISD-SEE (100) transistor channels are approximately same as the masked gate length where as the prior art devices have channel lengths defined by the extension of implanted dopant typically LDD under the gate of the devices. So comparisons have to be done based on the channel lengths rather than the masked gate lengths.

Implementation of NVM-ALEFT ISD-SEE (100) Transistor on SOI Substrate.

Even though the implementation described is on planar silicon wafers, the process and technology are adaptable to manufacture on an SOI wafer and other semiconductor wafers such as GaAs and SiN with changes well understood by practitioners of the art. Using the SOI wafer enables the devices to be implemented to accept back bias for further control of Vt values.

Drain Engineering for Short Channel Effects and Strain.

Use of strained silicon channel can be implemented in the above-disclosed process by adding silicon germanium or other appropriate undoped epitaxial material growth in the S/D region using and extending the use of the strain material to grow the extensions. But having reduced short channel effects will allow the gate length to be reduced substantially without undue need for strain engineering and drain engineering to achieve the needed speeds. By using undoped or low-doped epitaxial silicon as part of the substrate it is possible to achieve very high mobility for the carriers (close to intrinsic mobility) with reduced drain engineering and channel strain engineering.

Some Advantages of the Current Disclosed NVM-ALEFT ISD-SEE (100) with Patented LEFT ISD-SEE and Patent Pending ALEFT ISD-SEE Inventions Described Include:

All the advantages previously indicated for the patent pending LEFT ISD-SEE transistor and the patent pending ALEFT ISD-SEE transistor. In addition the NVM-ALEFT ISD-SEE provides the additional advantages of ease of integration with the currently patent pending ALEFT ISD-SEE.

1. Ability to scale the gate size to much smaller dimensions by using masking of the gate on flat surface and defining the gate by the low temperature selective epitaxial growth.
2. The us of thicker protection dielectric (to protect the low temperature selective epitaxial Source and drain extensions enable reduction in the gate to S/D coupling improving device performance.
3. Using the large area of coupling between the floating gate and the control gate of the NVM-ALEFT ISD-SEE transistor that allows a high coupling ratio between the floating gate and control gate to reduce the voltages required to write and erase the NVM-ALEFT ISD-SEE device.

4. The reduced write/erase voltage requirement reducing the stress on the peripheral ALEFT ISD-SEE transistors carrying the write/erase voltages.
5. Reducing the Vt variations due to random dopant distribution in and around the NVM-ALEFT ISD-SEE transistor channel a read operation can use low voltages.

Note Since the channel of the NVM-ALEFT ISD-SEE transistor is not impacted by the short channel effects, the channel length will be equal to the masked gate length. Typical transistors loose 20 to 25% of the masked gate length due to short channel effects, hence having a much shorter channel length.

Though the process and the implementation examples have been provided for both single crystal substrate and SOI substrate the technology shown should not be construed to be limited by the examples provided. The technology with additional changes is implementable into almost any semiconductor process, including high voltage process, FinFET process etc. with appropriate changes to improve the short channel effects and speed of the devices as will be well understood by practitioners of the art. These implementations though not shown in the application are being covered by the application.

Though a silicon based process is described in the current application, it should also be not considered limiting. The technology described may be implemented effectively to reduce process complexity and improve characteristic of other semiconductor devices, with changes in process as will be well understood by practitioners of the art. Other typical semiconductors include but are not limited to 3-5 compounds, Silicon Carbide etc. where the patent can be effectively applied.

What is claimed is:

1. A non-volatile memory (NVM) transistor structure that is capable of being read, written and erased electrically, on a system on chip (SOC) or an integrated circuit (IC);
the NVM transistor structure comprises a source implant and a drain implant into a surface of a semiconductor substrate, the implants spaced away from a channel under a gate dielectric on the surface of the semiconductor substrate;
wherein the channel is controlled by a voltage on a floating gate over the gate dielectric, the floating gate coupled to a conductive control gate overlaying the floating gate; and
wherein the channel is defined by a spacing between a selectively deposited epitaxial source extension and a selectively deposited epitaxial drain extension, both the source extension and the drain extension being on the surface of the semiconductor substrate, and both the source extension and the drain extension being in contact with the surface of the semiconductor substrate, the source extension being in further contact with the source implant and the drain extension being in further contact in contact with the drain implant.

2. The NVM of claim 1, wherein having the source implant and the drain implant spaced away from the channel and having the channel defined by the spacing between the epitaxial source extension and the epitaxial drain extension on the surface of the semiconductor substrate, enable a reduction of random dopant distribution near, under and within the channel, thereby reducing threshold Vt variations of the NVM enabling low voltage read operation of the NVM.

3. The NVM of claim 1, comprising a large area of coupling between the floating gate and the control gate.

4. The NVM of claim 3, wherein the large area coupling between the floating gate and the control gate of the NVM enable a high coupling ratio between the floating gate and control gate.

5. The NVM of claim 4, wherein the high coupling ratio enables use of a write and an erase voltage during operation.

6. The NVM of claim 1, wherein the SOC or IC is manufactured on a silicon or a silicon on Insulator substrate.

7. The NVM of claim 1, wherein the IC or SOC is using a III-V compound semiconductor material such as Gallium Arsenide (GaAs), Gallium Nitride (GaN) or Silicon Nitride (SiN) for the semiconductor substrate.

* * * * *